(12) United States Patent
Pandev

(10) Patent No.: US 11,200,658 B2
(45) Date of Patent: Dec. 14, 2021

(54) MODEL-BASED METROLOGY USING IMAGES

(71) Applicant: KLA-Tencor Corporation, Milpitas, CA (US)

(72) Inventor: Stilian Ivanov Pandev, Santa Clara, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 180 days.

(21) Appl. No.: 16/454,531

(22) Filed: Jun. 27, 2019

(65) Prior Publication Data

US 2019/0325571 A1 Oct. 24, 2019

Related U.S. Application Data

(63) Continuation of application No. 15/230,339, filed on Aug. 5, 2016, now Pat. No. 10,380,728.
(Continued)

(51) Int. Cl.
*G06T 7/00* (2017.01)
*G03F 7/20* (2006.01)
(Continued)

(52) U.S. Cl.
CPC ........ *G06T 7/0004* (2013.01); *G03F 7/70625* (2013.01); *G03F 7/70633* (2013.01);
(Continued)

(58) Field of Classification Search
CPC ....... G06T 7/00; G06T 7/0002; G06T 7/0004; G06T 7/0006; G06T 7/0008; G06T 7/001;
(Continued)

(56) References Cited

U.S. PATENT DOCUMENTS 5,608,526 A 3/1997 Piwonka-Corle et al.
5,859,424 A 1/1999 Norton et al.
(Continued)

FOREIGN PATENT DOCUMENTS

CN 102759533 B 3/2015
JP 2015102442 6/2015
(Continued)

*Primary Examiner* — Shefali D Goradia
(74) *Attorney, Agent, or Firm* — Spano Law Group; Joseph S. Spano

(57) ABSTRACT

Methods and systems for combining information present in measured images of semiconductor wafers with additional measurements of particular structures within the measured images are presented herein. In one aspect, an image-based signal response metrology (SRM) model is trained based on measured images and corresponding reference measurements of particular structures within each image. The trained, image-based SRM model is then used to calculate values of one or more parameters of interest directly from measured image data collected from other wafers. In another aspect, a measurement signal synthesis model is trained based on measured images and corresponding measurement signals generated by measurements of particular structures within each image by a non-imaging measurement technique. Images collected from other wafers are transformed into synthetic measurement signals associated with the non-imaging measurement technique and a model-based measurement is employed to estimate values of parameters of interest based on the synthetic signals.

20 Claims, 9 Drawing Sheets

Related U.S. Application Data

(60) Provisional application No. 62/212,113, filed on Aug. 31, 2015.

(51) Int. Cl.
  *H04N 5/225* (2006.01)
  *H04N 17/00* (2006.01)
  *G06K 9/52* (2006.01)
  *G06K 9/62* (2006.01)

(52) U.S. Cl.
  CPC ............. *G06K 9/522* (2013.01); *G06K 9/624* (2013.01); *G06K 9/6247* (2013.01); *G06K 9/6269* (2013.01); *G06K 9/6282* (2013.01); *G06T 2207/20081* (2013.01); *G06T 2207/30148* (2013.01); *H04N 5/2256* (2013.01); *H04N 17/002* (2013.01)

(58) Field of Classification Search
  CPC ....... G06T 2207/30148; G03F 7/70633; G03F 7/70625; G06K 9/522; G06K 9/6269; G06K 9/6282; G06K 9/624; G06K 9/6247; G06K 2207/20081; H04N 17/002; H04N 5/2256; G01N 21/9501; G01N 21/9515; H01L 22/12; G01B 2210/56
  USPC .......................................................... 382/145
  See application file for complete search history.

(56) References Cited

U.S. PATENT DOCUMENTS

| | | | |
|---|---|---|---|
| 6,429,943 B1 | 8/2002 | Opsal et al. | |
| 6,633,831 B2 | 10/2003 | Nikoonahad et al. | |
| 6,734,967 B1 | 5/2004 | Piwonka-Corle et al. | |
| 6,816,570 B2 | 10/2004 | Janik et al. | |
| 6,895,075 B2 | 5/2005 | Yokhin et al. | |
| 6,972,852 B2 | 12/2005 | Opsal et al. | |
| 7,478,019 B2 | 1/2009 | Zangooie et al. | |
| 7,826,071 B2 | 11/2010 | Shchegrov et al. | |
| 7,929,667 B1 | 4/2011 | Zhuang et al. | |
| 7,933,026 B2 | 4/2011 | Opsal et al. | |
| 8,462,329 B2 * | 6/2013 | Zhao ................. | G01N 21/8806 356/237.2 |
| 2002/0107660 A1 | 8/2002 | Nikoonahad | |
| 2004/0109173 A1 | 6/2004 | Finarov | |
| 2005/0185174 A1 | 8/2005 | Laan | |
| 2006/0009872 A1 | 1/2006 | Prager | |
| 2007/0198955 A1 | 8/2007 | Nagatomo | |
| 2009/0037134 A1 | 2/2009 | Kulkarni | |
| 2012/0026489 A1* | 2/2012 | Zhao ................. | G01N 21/9501 356/237.2 |
| 2012/0094400 A1 | 4/2012 | Adel et al. | |
| 2012/0226644 A1 | 9/2012 | Jin | |
| 2013/0077742 A1 | 3/2013 | Schueler et al. | |
| 2013/0208973 A1* | 8/2013 | Brill ......................... | G06T 7/80 382/145 |
| 2013/0304424 A1 | 11/2013 | Bakeman et al. | |
| 2014/0019097 A1 | 1/2014 | Bakeman et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2014/0316730 A1* | 10/2014 | Shchegrov .............. | H01L 22/12 702/81 |
| 2015/0033201 A1 | 1/2015 | Vaid et al. | |
| 2015/0046118 A1 | 2/2015 | Pandev et al. | |
| 2015/0046121 A1 | 2/2015 | Dziura et al. | |
| 2015/0114769 A1* | 4/2015 | Kim ........................ | F16D 65/18 188/72.4 |
| 2015/0144769 A1 | 5/2015 | Hiroto et al. | |
| 2015/0219446 A1 | 8/2015 | Leem et al. | |

FOREIGN PATENT DOCUMENTS

| | | |
|---|---|---|
| TW | 201510518 A | 3/2015 |
| WO | 2006044016 A2 | 4/2006 |

* cited by examiner

MODEL-BASED METROLOGY USING IMAGES

CROSS REFERENCE TO RELATED APPLICATIONS

The present application for patent is a continuation of, and claims priority under 35 U.S.C. § 120 from, U.S. patent application Ser. No. 15/230,339, entitled "Model-Based Metrology Using Images," filed Aug. 5, 2016, which, in turn claims priority under 35 U.S.C. § 119 from U.S. provisional patent application Ser. No. 62/212,113, entitled "Model-Based Metrology Using Images," filed Aug. 31, 2015, the subject matter of each is incorporated herein by reference in its entirety.

TECHNICAL FIELD

The described embodiments relate to metrology systems and methods, and more particularly to methods and systems for improved model-based measurements.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition, overlay and other parameters of nanoscale structures. Non-imaging, model-based optical metrology techniques generally acquire measurement signals sequentially and usually from metrology targets that are sparsely located on a field area of a semiconductor wafer. Although non-imaging, model-based optical metrology techniques offer high precision measurement capability, the number of locations that can be measured for a given wafer throughput requirement is limited.

In contrast, imaging based measurement systems collect large numbers of signals in parallel. Thus, the wafer area that can be characterized by imaging-based measurements for a given wafer throughput requirement is much larger compared to model-based optical metrology techniques. Unfortunately, at this time, imaging-based measurements lack sufficient resolution to directly measure complex three dimensional structures that are commonly manufactured today.

Image based measurements typically involve the recognition of specific target features (e.g., line segments, boxes, etc.) in an image and parameters of interest are calculated based on these features. Typically, the specialized target structures are specific to the image processing algorithm. For example, the line segments associated with an overlay target (e.g., box-in-box target, frame-in-frame target, advanced imaging metrology (AIM) target) are specifically designed to comply with the specifics of the algorithm. For this reason, traditional image based metrology algorithms cannot perform reliably with arbitrary targets or device structures.

In semiconductor manufacture, and patterning processes in particular, process control is enabled by performing metrology on specific dedicated structures. These dedicated structures may be located in the scribe lines between dies, or within the die itself. The measurement of dedicated metrology structures by traditional scatterometry based metrology techniques is time consuming.

Future metrology applications present challenges for image based metrology due to increasingly small resolution requirements and the increasingly high value of wafer area. Thus, methods and systems for improved image-based measurements are desired.

SUMMARY

Methods and systems for combining the information content present in measured images of semiconductor wafers with additional measurements of particular structures within the measured images to quickly and accurately estimate structural parameters of interest are presented herein.

In one aspect, the high information content present in measured images is transformed into estimated values of structural parameters of interest. An image-based signal response metrology (SRM) model is trained based on measured, image-based training data (e.g., images collected from a Design of Experiments (DOE) wafer) and corresponding reference measurement data. The trained, image-based measurement model is then used to calculate values of one or more parameters of interest directly from measured image data collected from other wafers. The trained, image-based SRM models described herein receive image data directly as input and provide estimates of values of one or more parameters of interest as output. By streamlining the measurement process, the predictive results are improved along with a reduction in computation and user time.

By using only raw image data to create the image-based measurement model, as described herein, the errors and approximations associated with traditional image based metrology methods are reduced. In addition, the image-based measurement model is not sensitive to systematic errors, asymmetries, etc. because the image-based measurement model is trained based on image data collected from a particular metrology system and used to perform measurements based on images collected from the same metrology system.

In another aspect, measured images are transformed into synthetic non-imaging based measurement signals associated with a model-based measurement technique at one or more locations a field. The model-based measurement technique is employed to estimate values of structural parameters of interest based on the synthetic signals. A measurement signal synthesis model is trained based on measured, image-based training data (e.g., images collected from a Design of Experiments (DOE) wafer) and corresponding non-imaging measurement data. In a further aspect, synthetic signals are generated for multiple structures in different locations in each imaged field. In some examples, performing model based measurements based on the synthetic signals is significantly faster than acquiring actual measurement data at each different location.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for combining the information content present in measured images of semiconductor wafers with additional measurements of particular structures within the measured images to quickly and accurately estimate structural parameters of interest are presented herein.

Figure 1:
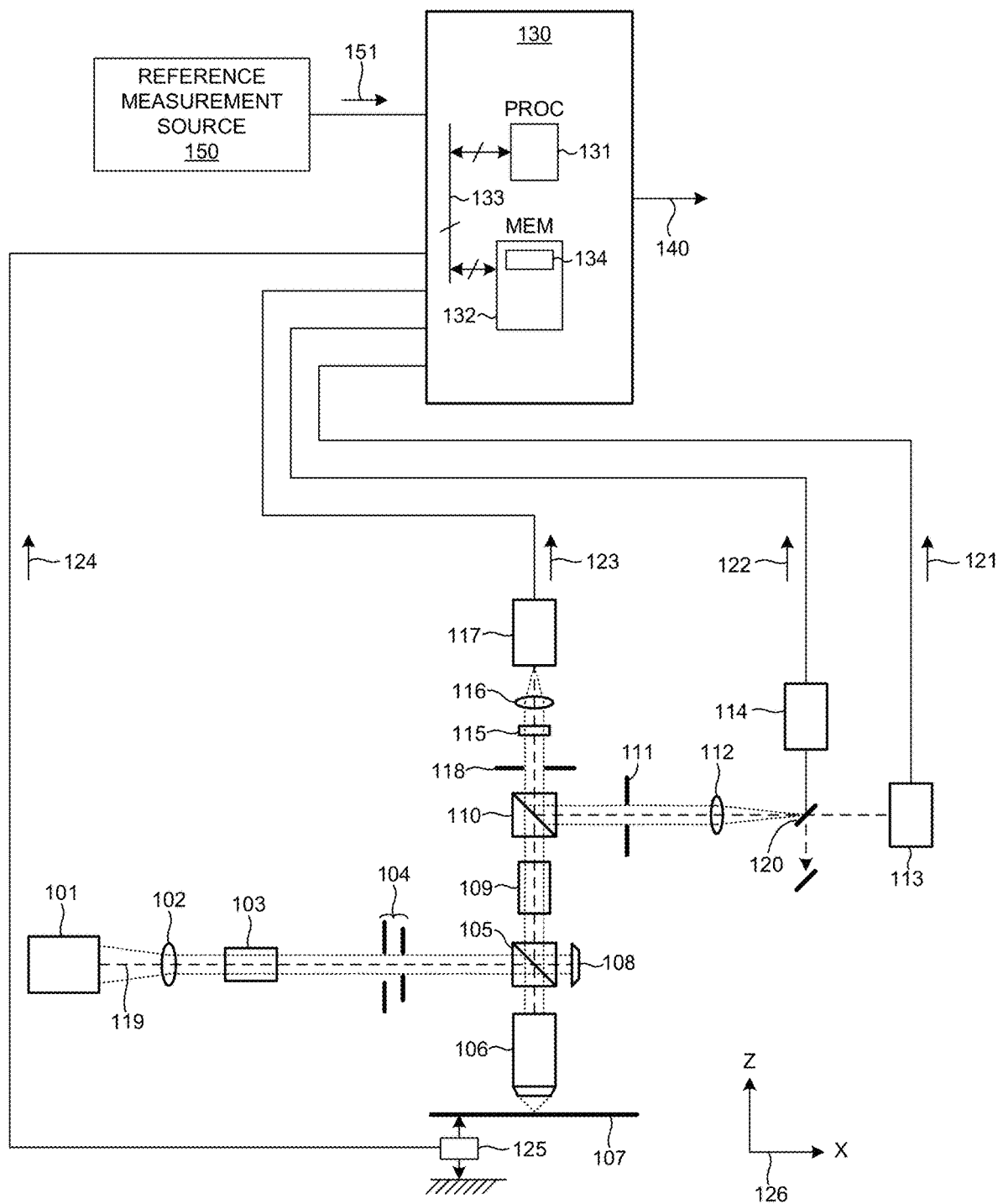
FIG. 1 illustrates a system 100 for performing measurements of parameters of interest in accordance with the exemplary methods presented herein.

FIG. 1 illustrates a system 100 for measuring characteristics of a specimen in accordance with the exemplary methods presented herein. As shown in FIG. 1, the system 100 may be used to perform imaging and non-imaging measurements of one or more structures formed on a specimen 107. In this aspect, the system 100 may configured as a beam profile reflectometer (BPR), a field imaging system, and a spectroscopic reflectometer (SR). Alternatively, system 100 may be configured as a BPR, a spectroscopic ellipsometer (SE), and a field imaging system. System 100 includes a high numerical aperture (NA) objective lens (e.g., NA>0.9) and at least one collection beam splitter 110 to generate an optical path to the pupil detector 117 and another optical path to the field detector 113 or 114. The field detector and pupil detector acquire field signals 121 or 122 and pupil signals 123, respectively, from specimen 107. Field images or pupil images are processed to estimate one or more structural or process parameter values.

As depicted in FIG. 1, system 100 includes an illumination source 101 that generates an amount of illumination light 119. In some embodiments, illumination source 101 is a broadband illumination source such as a xenon lamp, a laser driven light source, a multiple wavelength laser, a supercontinuum laser, etc. In some other embodiments, illumination source 101 includes a narrowband light source such as a single wavelength laser, a tunable narrowband laser, etc. In some embodiments, illumination source 101 includes a combination of broadband and narrowband illumination sources. In some embodiments, optical filters are included to select one or more illumination wavelength(s) and corresponding wavelength range(s).

As depicted in FIG. 1, illumination light 119 passes through illumination optics 102. Illumination optics 102 focus and collimate the illumination light. Illumination optics 102 include lens components, mirror components, or a combination of both. Illumination light passes through one or more selectable illumination apertures 104 before reaching illumination beam splitter 105. In some embodiments, the selectable illumination apertures 104 include a set of illumination field stops and a set of illumination pupil stops. The illumination field stops are configured to select the illumination spot size projected onto specimen 107. The illumination pupil stops are configured to select the illumination pupil projected onto specimen 107. The illumination field stops and pupil stops operate in conjunction with other illumination optics components (e.g., illumination optics 102 and objective 106) to achieve an illumination NA tuned for optimal light throughput, illumination field of view, and pupil on the surface of specimen 107. The aperture(s) of the selectable illumination apertures 104 may be formed by any suitable device including, but not limited to a mechanical pin-hole, a spatial light modulator (SLM), an apodizer, and any other beam forming and controlling component or sub-system.

Illumination beam splitter 105 directs a portion of the collimated illumination light to objective 106 and directs another portion of the collimated illumination light to intensity monitor 108. In some embodiments, intensity monitor 108 is communicatively coupled to computing system 130 and provides an indication of the overall illumination intensity, the illumination intensity profile, or both, to computing system 130. Objective 106 directs illumination light to the surface of specimen 107 over a broad range of angles of incidence. Light reflected, diffracted, and scattered from the surface of specimen 107 is collected by objective 106 and passes through collection beam splitter 110. A portion of the collected light is directed through a field detection path, while another portion of the collected light is directed through a pupil detection path. Illumination beam splitter 105 and collection beam splitter 110 may include any suitable beam splitting element including, but not limited to, a cubic beam splitter, a metallic coating plate, a dichroic optical coating plate, or other beam splitting mechanism.

The field detection path includes a selectable field collection aperture 111, focusing field optics 112, and at least one field detector. In some embodiments, the selectable field collection aperture 111 includes a set of field stops to select signals for projection onto field signal detectors 113 or 114. In some examples, higher order field signals are selected for projection onto field signal detectors 113 or 114. The aperture(s) of the selectable field collection aperture 111 may be formed by any suitable device including, but not limited to a mechanical pin-hole, a spatial light modulator (SLM), an apodizer, and any other beam forming and controlling component or sub-system.

In the embodiment depicted in FIG. 1, system 100 includes a field imaging detector 114 and a spectroscopic field detector 113. A flip-in mirror mechanism 120 is selectively located in the field detection path based on a command signal (not shown) received from computing system 130. In one configuration, flip-in mirror mechanism 120 is located in the field detection path and the collected light is directed to field imaging detector 114. In another configuration, flip-in mirror mechanism 120 is located outside the field detection path and the collected light is directed toward spectroscopic field detector 113. In this manner, system 100 is configured to perform either image-based or spectroscopic based field measurements. In one embodiment, field imaging detector 114 images a portion of the wafer surface illuminated by the illumination source onto the detector. Field imaging detector 114 may be CCD camera, CMOS camera, array detector, etc.

The pupil detection path includes a selectable pupil collection aperture 118, a selectable narrow band pass filter 115, and pupil relay optics 116 that direct the collected light to pupil detector 117. In some embodiments, the selectable pupil collection aperture 118 includes a set of field stops to select signals for projection onto pupil signal detector 117. In some examples, higher order pupil signals are selected for projection onto pupil signal detector 117. The aperture(s) of the selectable pupil collection aperture 118 may be formed by any suitable device including, but not limited to a mechanical pin-hole, a spatial light modulator (SLM), an apodizer, and any other beam forming and controlling component or sub-system.

In the depicted embodiment, pupil detector 117 is an imaging detector. However, in some other embodiments, pupil detector 117 is a spectroscopic detector. In general, the pupil detection path may include one or more pupil detectors configured to collect pupil data simultaneously or sequentially.

As described herein, the pupil images detected by pupil imaging detector 117 or the field images detected by field imaging detector 114 may be used to measurement parameters of interest directly based on an image based SRM model, or indirectly, based on a measurement signal synthesis model, as described herein. In one embodiment, spectroscopic field detector 113 is a spectrometer. By way of non-limiting example, the detected spectra may also be used for measurement of parameters of interest. Exemplary parameters of interest include any of a critical dimension (CD) parameter, an overlay parameter, a focus parameter, a dose parameter, a structure asymmetry parameter, a structure roughness parameter, a directed self assembly (DSA) pattern uniformity parameter, a pitch walk parameter, etc.

In the embodiment depicted in FIG. 1, system 100 includes a polarizer 103 in the illumination path and an analyzer 109 in the collection path. Depending on whether polarizer 103 is rotating or not, system 100 may be configured to perform spectroscopic reflectometry (SR) measurements or spectroscopic ellipsometry (SE) measurements. In this manner, system 100 may be selectively configured to perform SR or SE measurements.

In addition, system 100 includes a measurement device (e.g., encoder 125) configured to measure the position of specimen 107 relative to the optical system in the direction perpendicular to the surface of specimen 107 (i.e., z-direction depicted in coordinate frame 126). In this manner, encoder 125 provides an indication of the focus position of specimen 107 relative to the optical system. Pupil signals 123 and field signals 121 or 122 can be collected along with an indication of focus position 124 for analysis by computing system 130. Based on an estimate of focus position, computing system 130 communicates command signals to either a wafer positioning system (not shown) or an optical positioning system (not shown) to adjust the focus position of specimen 107 relative to the optical system. In this manner, the focus position of specimen 107 is monitored and adjusted during image acquisition. In some other examples, image data is collected while moving the focus position of specimen 107 incrementally or continuously in the z-direction.

Traditionally, model based measurements of parameters of interest are performed based on non-imaging measurement data (e.g., spectral data collected by detector 113). For example, model based CD measurement involves a CD measurement model including a parameterization of a metrology target in terms of the CD parameter of interest. In addition, the measurement model includes a parameterization of the measurement tool itself (e.g., wavelengths, angles of incidence, polarization angles, etc.). In addition, simulation approximations (e.g., slabbing, Rigorous Coupled Wave Analysis (RCWA), etc.) are carefully performed to avoid introducing excessively large errors. Discretization and RCWA parameters are defined.

Machine parameters ($P_{machine}$) are parameters used to characterize the metrology tool itself. Exemplary machine parameters include angle of incidence (AOI), analyzer angle (A0), polarizer angle (P0), illumination wavelength, numerical aperture (NA), etc. Specimen parameters ($P_{specimen}$) are parameters used to characterize the geometric and material properties of the specimen.

For measurement purposes, the machine parameters of the multi-target model are treated as known, fixed parameters and the specimen parameters of the measurement model, or a subset of specimen parameters, are treated as unknown, floating parameters. The floating parameters are resolved by a fitting process (e.g., regression, library matching, etc.) that produces the best fit between theoretical predictions and measured data. The unknown specimen parameters, $P_{specimen}$, are varied and the model output values are calculated until a set of specimen parameter values are determined that results in a close match between the model output values and the measured values. Performing measurements in this manner is computationally expensive.

In one aspect, the high information content present in measured images is transformed into estimated values of structural parameters of interest. An image-based signal response metrology (SRM) model is trained based on measured, image-based training data (e.g., images collected from a Design of Experiments (DOE) wafer) and corresponding reference measurement data. The trained, image-based measurement model is then used to calculate values of one or more parameters of interest directly from measured image data collected from other wafers. The trained, image-based SRM models described herein receive image data directly as input and provide estimates of values of one or more parameters of interest as output. By streamlining the measurement process, the predictive results are improved along with a reduction in computation and user time.

By using only raw image data to create the image-based measurement model, as described herein, the errors and approximations associated with traditional image based metrology methods are reduced. In addition, the image-based measurement model is not sensitive to systematic errors, asymmetries, etc. because the image-based measurement model is trained based on image data collected from a particular metrology system and used to perform measurements based on images collected from the same metrology system.

In some examples, the image-based SRM model can be created in less than an hour. In addition, by employing a simplified model, measurement time is reduced compared to existing image based metrology methods. Additional modeling details are described in U.S. Patent Publication No. 2014/0297211 and U.S. Patent Publication No. 2014/0316730, the subject matter of each are incorporated herein by reference in their entirety.

In general, the methods and systems described herein analyze each image as a whole. Instead of recognizing individual features in the image, each pixel is considered as an individual signal containing information about (or sensitive to) structural parameters, process parameters, dispersion parameters, etc.

Figure 2:
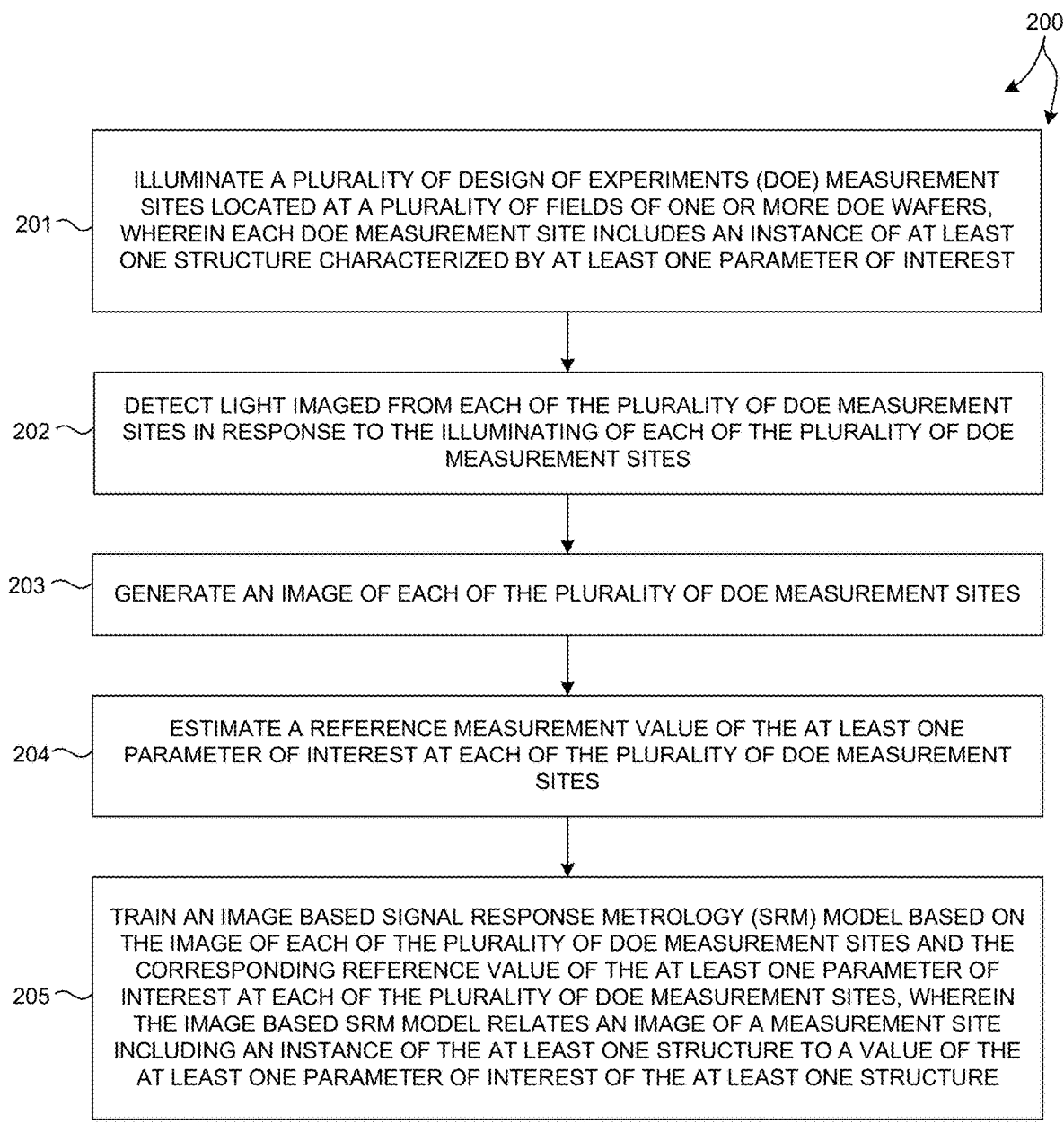
FIG. 2 is a flowchart illustrative of a method 200 of training an image based SRM model as described herein.

FIG. 2 illustrates a method 200 suitable for implementation by a measurement system such as measurement system 100 illustrated in FIG. 1 of the present invention. In one aspect, it is recognized that data processing blocks of method 200 may be carried out via a pre-programmed algorithm executed by one or more processors of computing system 130, or any other general purpose computing system. It is recognized herein that the particular structural aspects of measurement system 100 do not represent limitations and should be interpreted as illustrative only.

In block 201, a plurality of Design Of Experiments (DOE) measurement sites are illuminated by an illumination source. The DOE measurement sites are located at a number of different fields located on one or more DOE wafers. Each DOE measurement site includes an instance of at least one structure characterized by at least one parameter of interest. The structure can be a dedicated metrology target, device structure, grating structure, etc.

The parameters of interest include one or more process parameters, structural parameters, dispersion parameters, or layout parameters. Each of the measurement sites includes the same nominal structures at the same nominal locations within each of the measurement sites. In one example, a measurement site encompasses a field area of a semiconductor wafer that is repeatedly constructed across the wafer surface. In some examples, a measurement site encompasses a die area that is repeatedly constructed across the wafer surface. Although, each measurement site nominally includes the same structures, in reality, and for purposes of model training, each measurement site includes variations of various parameters (e.g., CD, sidewall angle, height, overlay, etc.).

Figure 4:
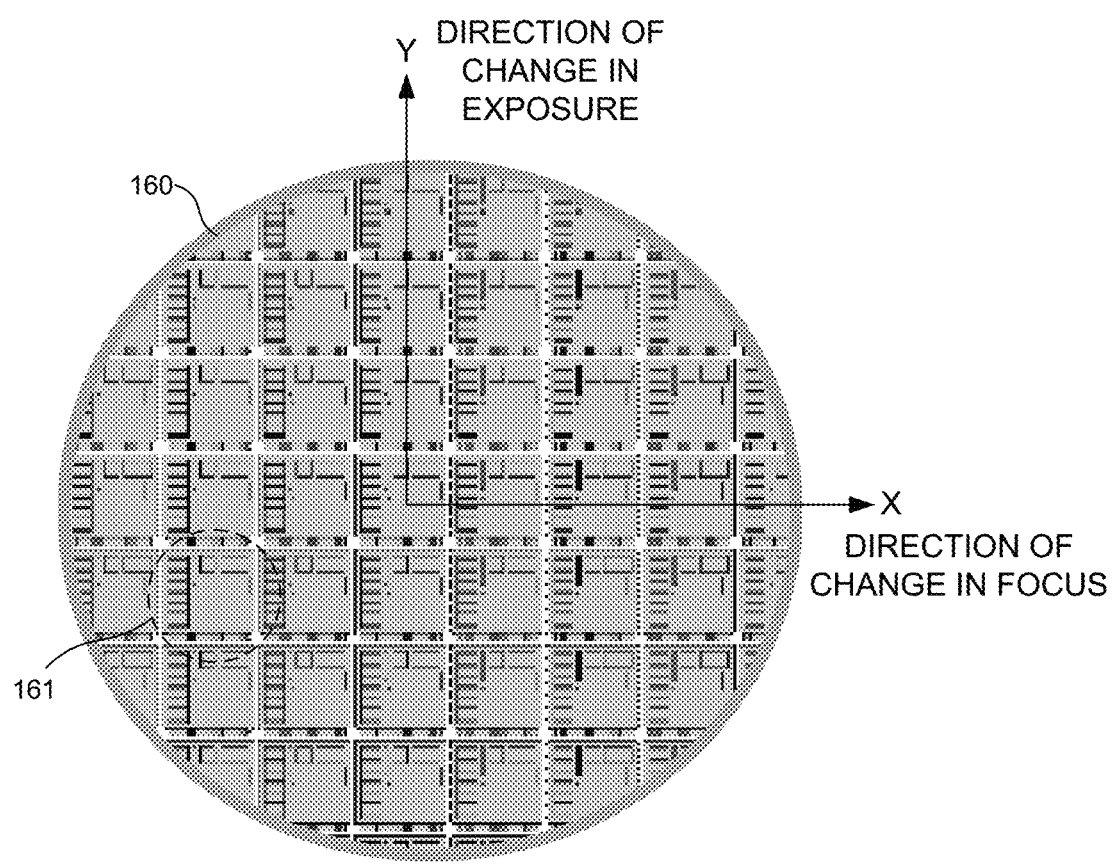
FIG. 4 depicts a design of experiments wafer 1600 having a grid of measurement sites including structures that exhibit known variations of one or more parameters of interest.

For purposes of model training, variations of the parameter(s) of interest are organized in a Design of Experiments (DOE) pattern on the surface of a semiconductor wafer (e.g., DOE wafer). In this manner, the measurement sites at different locations on the wafer surface correspond to different values of the parameter(s) of interest. In one example, the DOE pattern is a focus exposure matrix (FEM) pattern. Typically, a DOE wafer exhibiting an FEM pattern includes a grid pattern of measurement sites. In one grid direction (e.g., the x-direction), the focus is varied while the exposure is held constant. In the orthogonal grid direction (e.g., the y-direction), the exposure is varied while the focus is held constant. In this manner, image data collected from the DOE wafer includes data associated with variations in focus and exposure. FIG. 4 depicts a DOE wafer 160 having a grid of measurement sites (e.g., measurement site 161) including structures that exhibit variations in the parameter(s) of interest (e.g., focus and exposure). The focus varies as a function of location on the DOE wafer 160 in the x-direction. The exposure varies as a function of location on the DOE wafer 160 in the y-direction.

Figure 5:
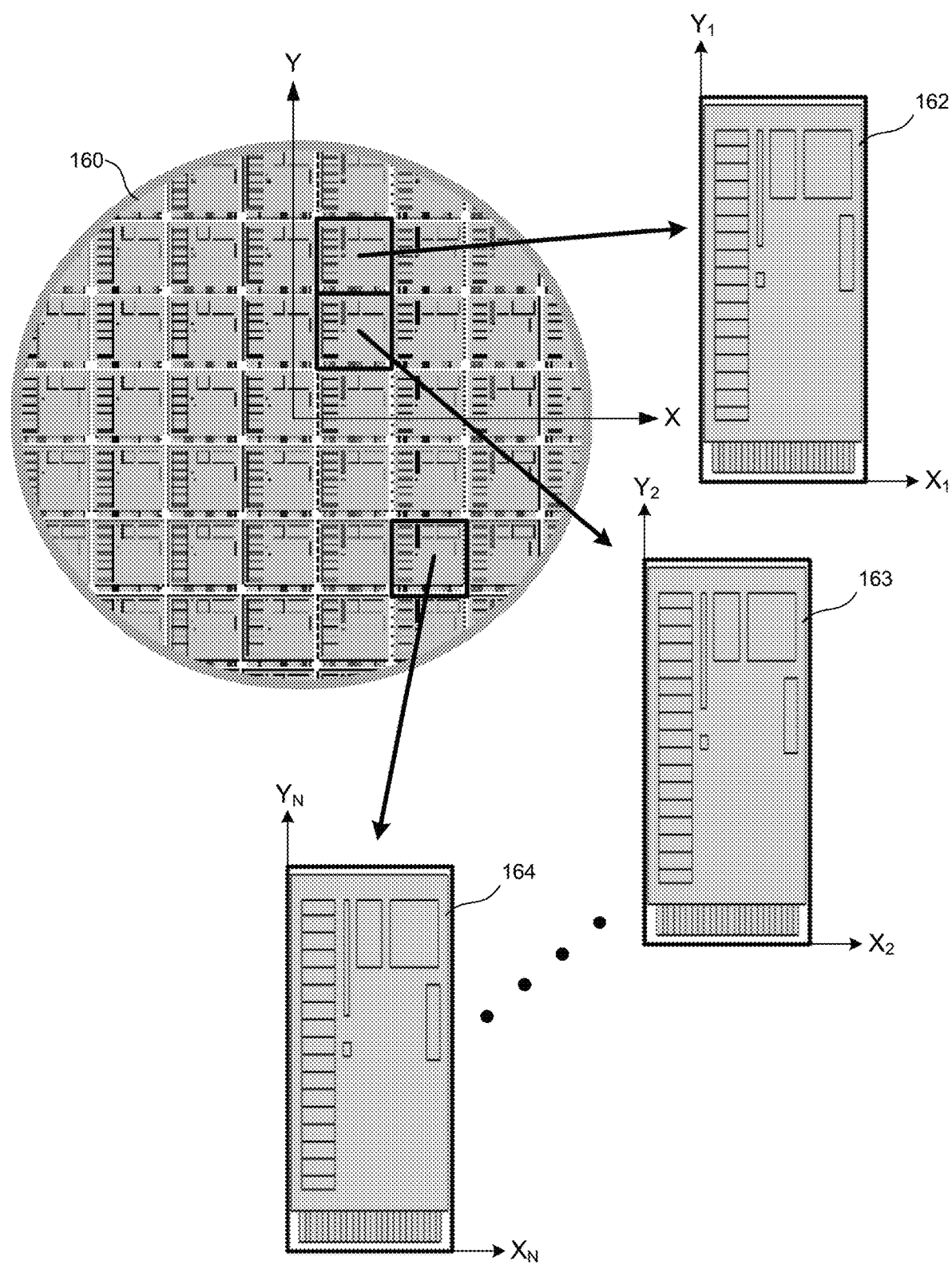
FIG. 5 depicts illustrative images 162-164 of different measurement sites of wafer 160.

In some embodiments, the images include device areas. Each pixel of a particular image of a measurement site represents the intensity of the collected light under specific illumination and collection conditions, wavelengths, polarization, etc. FIG. 5 depicts images 162-164 of different measurement sites of wafer 160. Each image represents an aerial view of the device structures within a measurement site. The measurement site is identified by its X and Y coordinates.

In some other embodiments, the images include specific targets designed to facilitate image-based measurement of the parameter(s) of interest. A specially designed target may be employed to improve device representation, maximize sensitivity to the parameter(s) of interest (focus, dose, CD), and reduce correlation to process variation.

In the aforementioned example, the image data is associated with a DOE wafer processed with variations in focus and exposure (i.e., dose). However, in general, image data associated with any variation of process parameters, structural parameter, dispersion, etc., may be contemplated. The images of the DOE wafer should exhibit ranges of the parameter(s) of interest.

In block 202, light imaged from each of the plurality of DOE measurement sites is detected in response to the illuminating of each of the plurality of DOE measurement sites. In one example, field imaging detector 114 depicted in FIG. 1 detects light imaged from the surface of wafer 107 at each DOE measurement site. In another example, pupil imaging detector 117 detects light imaged from the pupil of objective 106 at each DOE measurement site.

In block 203, an image of each of the plurality of DOE measurement sites is generated. In one example, field imaging detector 114 generates an image of each of the DOE measurement sites and communicates signals 122 indicative of each generated image to computing system 130. In another example, pupil imaging detector 117 generates a pupil image of each of the DOE measurement sites and communicates signals indicative of each generated pupil image to computing system 130.

In some examples, a single image of each measurement site is generated. In these examples, each image of each measurement site includes a single measurement signal value associated with each image pixel. In some examples, the single measurement value is a reflectance at the location of each pixel measured by an imaging reflectometer at a particular set of measurement system settings (e.g., wavelength, polarization, angle of incidence, azimuth angle, etc.).

In some other examples, multiple images of each measurement site are generated. Each of the images of each measurement site includes a single measurement signal value associated with each pixel. Thus, multiple measurement signal values are measured for each pixel. In general, each of the images of each measurement site is measured either by the same measurement system at different settings (e.g., wavelength, polarization, angle of incidence, azimuth angle, etc.), a different measurement technique, or a combination thereof. In this manner, a diverse set of measurement data may be assembled for each pixel of each measurement site. In general, image data can be collected from any imaging based system such as an optical imaging system, a microscope, a scanning electron microscope, a tunneling electron microscope, or other image forming systems.

In block 204, a reference measurement value of the at least one parameter of interest is estimated at each of the plurality of DOE measurement sites by a trusted, reference metrology system. Reference measurements are performed by a reference measurement system, or combination of reference measurement systems based on any suitable metrology technique, or combination of metrology techniques. By way of non-limiting example, any of a scanning electron microscope, an optical based measurement system, an x-ray based measurement system, a tunneling electron microscopy system, and an atomic force microscopy system may be employed to perform reference measurements of DOE measurement sites.

As depicted in FIG. 1, in one example, reference measurements 151 of parameters of interest at each DOE measurement site are communicated from a reference measurement source 150 to computing system 130.

In another example, depicted in FIG. 1, spectroscopic field detector 113 generates measurement signals 121 indicative of light collected from one or more structures characterized by each parameter of interest within each measurement site. In this example, the measurement signals are spectroscopic scatterometry signals. Computing system 130 performs a model based measurement (e.g., optical critical dimension measurement) to estimate the value of each parameter of interest at each measurement site based on the detected measurement signals 121.

Figure 6:
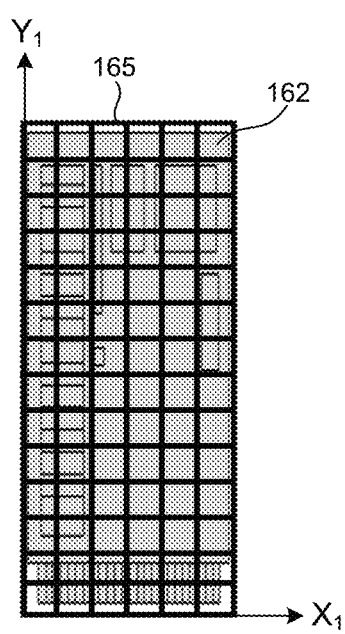
FIG. 6 illustrates a grid of pixels 165 associated with image 162.

In an optional block (not shown), each of the images is aligned with a common reference location of each measurement site. In this manner, any particular pixel from each image corresponds to the same location on each imaged measurement site. In one example, the collected images are aligned such that they match the first image of the set. FIG. 6 illustrates a grid of pixels 165 associated with image 162. In some examples, the measurement system operates at high precision and additional image alignment is not necessary. In this sense, image alignment is optional.

In another optional block (not shown), each of the images is filtered by one or more image filters. Image filters may be employed for noise reduction, contrast enhancement, etc. In one example, image filters may be employed to reduce edge effects by detecting edges and removing or masking the edges and proximate regions. In this manner, subsequent image samples are taken from relatively homogenous device regions. The image filters employed may be selected by a user or by an automatic procedure. The number of different image filters and the parameters associated with each selected filter are chosen to improve the final measurement result without undue computational burden. Although, the use of image based filters may be advantageous, in general, it is not necessary. In this sense, image filtering is optional.

Each image of each measurement site may include millions of pixels, and only a small number of those pixels have any correlation with the parameters of interest. In another optional block (not shown), a subset of the pixels associated with each of the first plurality of images is selected for model training and measurement. The measurement signal values associated with the same selected pixels of each of the first plurality of images are used for model training and measurement. In many examples, this is desirable to minimize computational effort.

Figure 7:
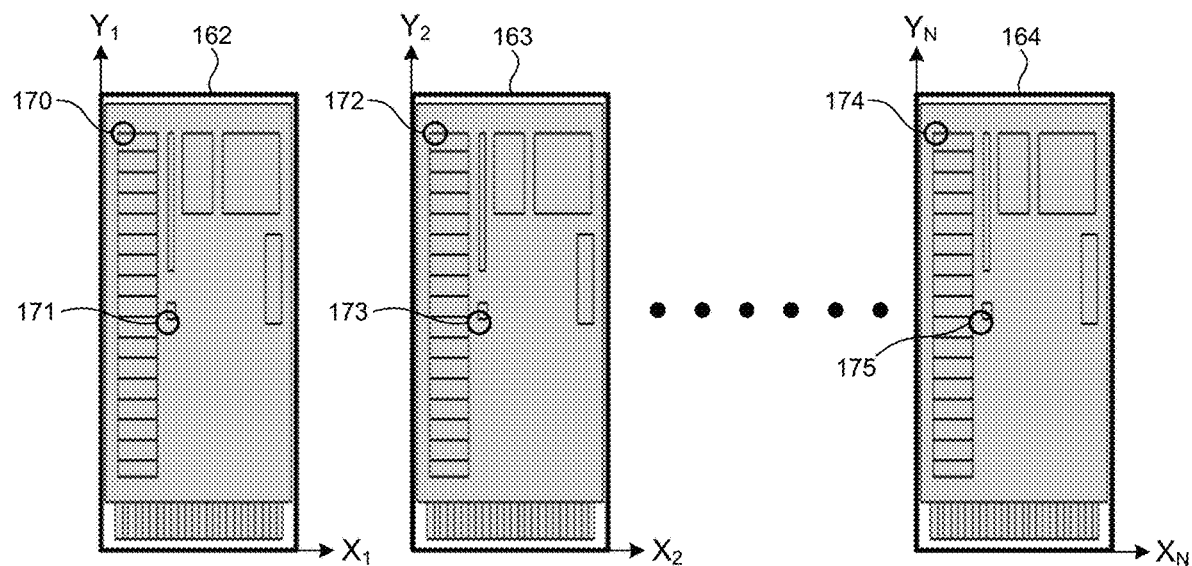
FIG. 7 depicts different pixel locations selected for model training and measurement in accordance with method the methods described herein.
Figure 8:
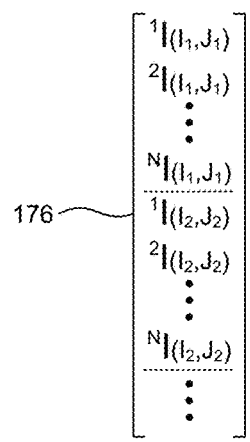
FIG. 8 depicts a vector 176 of measured intensity values sampled at the pixel locations illustrated in FIG. 7.

FIG. 7 depicts two different groups of pixels at different locations selected for model training and measurement. In the depicted example, pixel groups 170, 172, and 174 correspond to the same location on images 162, 163, and 164, respectively. Similarly, pixel groups 171, 173, and 175 correspond to the same location on images 162, 163, and 164, respectively. The measurement signals associated with each of these pixels are used for model training and measurement. FIG. 8 depicts a vector 176 of measured intensity (e.g., reflectance) values sampled at the pixel locations illustrated in FIG. 7. This sampled image data is used for model training and measurement. In the example depicted in FIG. 8, $^1I_{(I1,J1)}$ is the intensity value associated with pixel group 170 of image 162, $^2I_{(I1,J1)}$ is the intensity value associated with pixel group 172 of image 163, and $^NI_{(I1,J1)}$ is the intensity value associated with pixel group 174 of image 164. Similarly, $^1I_{(I2,J2)}$ is the intensity value associated with pixel group 171 of image 162, $^2I_{(I2,J2)}$ is the intensity value associated with pixel group 173 of image 163, and $^NI_{(I2,J2)}$ is the intensity value associated with pixel group 175 of image 164. In this manner, vector 176 includes intensity measurement signals from pixels groups at the same location of each imaged measurement site.

In some examples, pixels or groups of pixels are selected for their proximity to structures characterized by the parameters of interest. In one example, selected pixels are associated with an area around a structure of interest that is five to ten times as large as the structure of interest. In other examples, pixel locations are selected randomly. In some other examples, the pixel locations are selected based on their measurement sensitivity. In one example, the variance of measurement signal values associated with each pixel location is calculated from the ensemble of images. The variance associated with each pixel location is a metric that characterizes the measurement sensitivity at each corresponding pixel location. Pixel locations with relatively high variance offer higher measurement sensitivity and are selected for further analysis. Pixel locations with relatively low variance offer lower measurement sensitivity and are discarded. In some examples, a predetermined threshold value for variance is selected, and pixel locations with a variance that exceeds the predetermined threshold value are selected for model training and measurement. In this manner, only the most sensitive locations are sampled. In some examples, all of the pixels associated with each of the first plurality of images are selected for model training and measurement. In this sense, pixel selection is optional.

In another optional block (not shown), a feature extraction model is determined based on the selected image data. The feature extraction model reduces a dimension of the image data. A feature extraction model maps the original signals to a new reduced set of signals. The transformation is determined based on the variations in the parameter(s) of interest in the selected images. Each pixel of each image is treated as an original signal that changes within the process range for different images. The feature extraction model may be applied to all of the image pixels, or a subset of image pixels. In some examples, the pixels subject to analysis by the feature extraction model are chosen randomly. In some other examples, the pixels subject to analysis by the feature extraction model are chosen due to their relatively high sensitivity to changes in the parameter(s) of interest. For example, pixels that are not sensitive to changes in the parameter(s) of interest may be ignored.

By way of non-limiting example, the feature extraction model may a principal component analysis (PCA) model, a kernel PCA model, a non-linear PCA model, an independent component analysis (ICA) model or other dimensionality reduction methods using dictionaries, a discrete cosine transform (DCT) model, fast fourier transform (FFT) model, a wavelet model, etc.

In a typical design of experiments, the locations on the wafer are programmed to have specific geometric and process parameter values (e.g., focus, dose, overlay, CD, sidewall angle, height etc.). Hence the principal components representation allows mapping one or more signal representations as a function of process parameters or geometric parameters over the entire wafer. The nature of the pattern captures the essential properties of the device, whether it includes isolated or dense features.

In block 205, an image based signal response metrology (SRM) model is trained based on the generated images, or features extracted from the generated images and the reference values of the at least one parameter of interest. The image-based SRM model is structured to receive image data generated by a metrology system at one or more measurement sites, and directly determine the parameter(s) of interest associated with each measurement target. In some embodiments, the image-based measurement model is implemented as a neural network model. In one example, the number of nodes of the neural network is selected based on the features extracted from the image data. In other examples, the image-based SRM model may be implemented as a linear model, a polynomial model, a response surface model, a support vector machines model, or other types of models. In some examples, the image-based measurement model may be implemented as a combination of models. In some examples, the selected model is trained based on the reduced set of signals determined from the feature extraction model and the measured reference values of the parameter(s) of interest. The model is trained such that its output fits the measured reference values of the parameter(s) of interest for all the images in the parameter variation space defined by the DOE images.

As depicted in FIG. 1, computing system 130 trains an image-based SRM model such that its output fits the reference values received from reference measurement source 150 or reference values calculated based on measurement signals 121 for each DOE image of each DOE measurement site received from field imaging detector 114 or pupil imaging detector 117.

Figure 3:
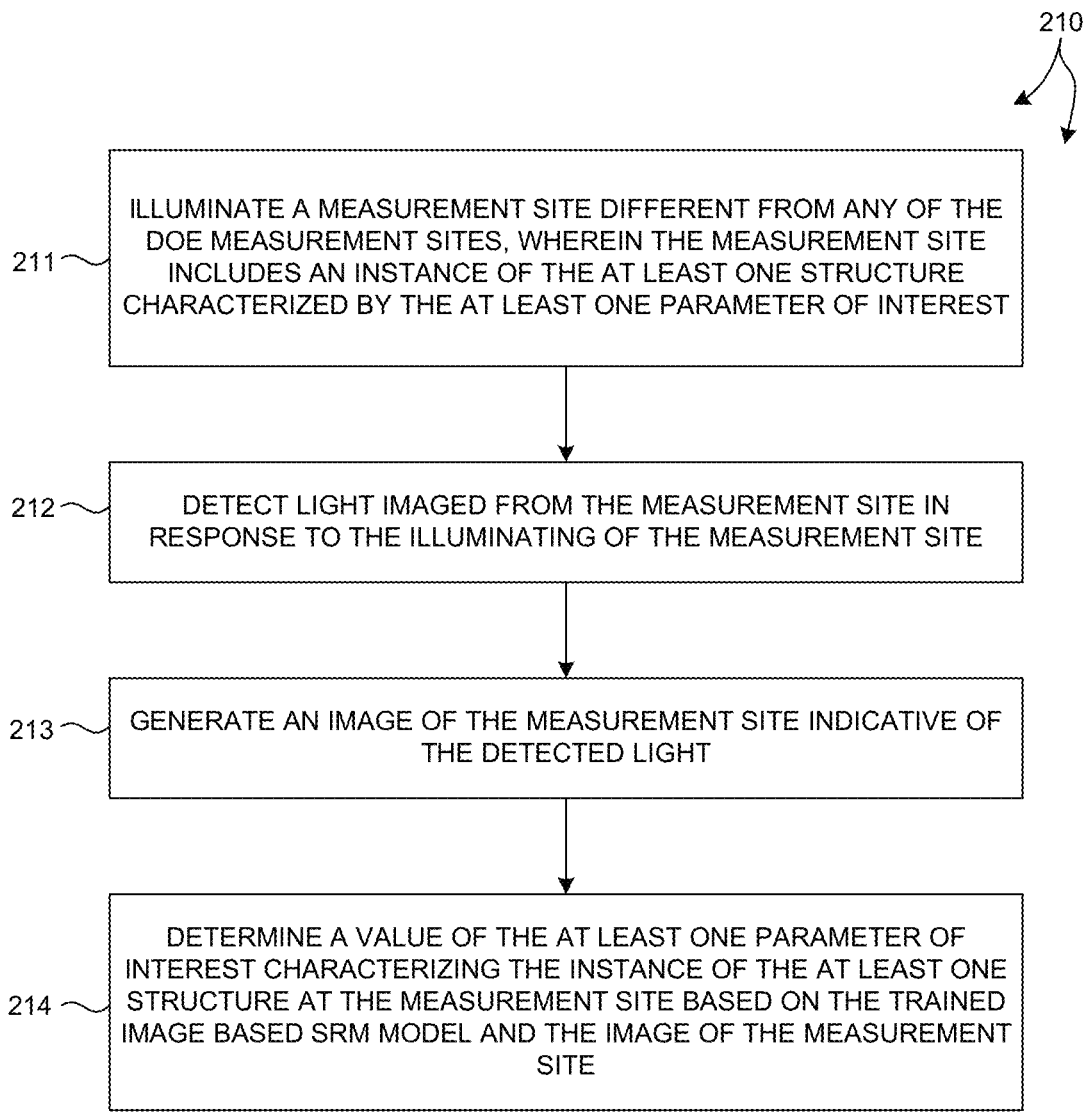
FIG. 3 is a flowchart illustrative of a method 210 of performing measurements of a structure using the trained SRM model described with reference to method 400.

In another aspect, the trained image based SRM model is employed as the measurement model for measurement of other wafers. FIG. 3 illustrates a method 210 suitable for implementation by a metrology system such as metrology system 100 illustrated in FIG. 1 of the present invention. In one aspect, it is recognized that data processing blocks of method 210 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 211, a measurement site is illuminated in accordance with the same image based metrology technique, or combination of image based metrology techniques employed to generate the images used to train the image based SRM model. The measurement site is a different measurement site than any of the DOE measurement sites. The measurement site includes an instance of at least one structure characterized by the parameter(s) of interest.

In block 212, light imaged from the measurement site is detected in response to the illuminating of the measurement site. In one example, field imaging detector 114 depicted in FIG. 1 detects light imaged from the surface of wafer 107 at the measurement site. In another example, pupil imaging detector 117 detects light imaged from the pupil of objective 106 at the measurement site.

In block 213, an image of the measurement site is generated. In one example, field imaging detector 114 generates an image of the measurement site and communicates signals 122 indicative of the generated image to computing system 130. In another example, pupil imaging detector 117 generates a pupil image of the measurement site and communicates signals indicative of the generated pupil image to computing system 130.

In some examples, the image data is subjected to the same alignment, filtering, sampling, and feature extraction steps described with reference to method 200. Although, the use of any, or all, of these steps may be advantageous, in general, it is not necessary. In this sense, these steps are optional.

In block 214, the value of at least one parameter of interest characterizing the instance of the structure at the measurement site is determined based on the trained image based SRM model and the image of the measurement site. The image of measurement site is processed by the image based SRM model to determine the value(s) of the parameter(s) of interest.

In another block (not shown), the determined value(s) of the parameter(s) of interest are stored in a memory. For example, the parameter values may be stored on-board the measurement system 100, for example, in memory 132, or may be communicated (e.g., via output signal 140) to an external memory device.

In another aspect, measured images are transformed into synthetic non-imaging based measurement signals associated with a model-based measurement technique at one or more locations a field. The model-based measurement technique is employed to estimate values of structural parameters of interest based on the synthetic signals. A measurement signal synthesis model is trained based on measured, image-based training data (e.g., images collected from a Design of Experiments (DOE) wafer) and corresponding non-imaging measurement data. In a further aspect, synthetic signals are generated for multiple structures in different locations in each imaged field. In some examples, performing model based measurements based on the synthetic signals is significantly faster than acquiring actual measurement data at each different location.

Figure 9:
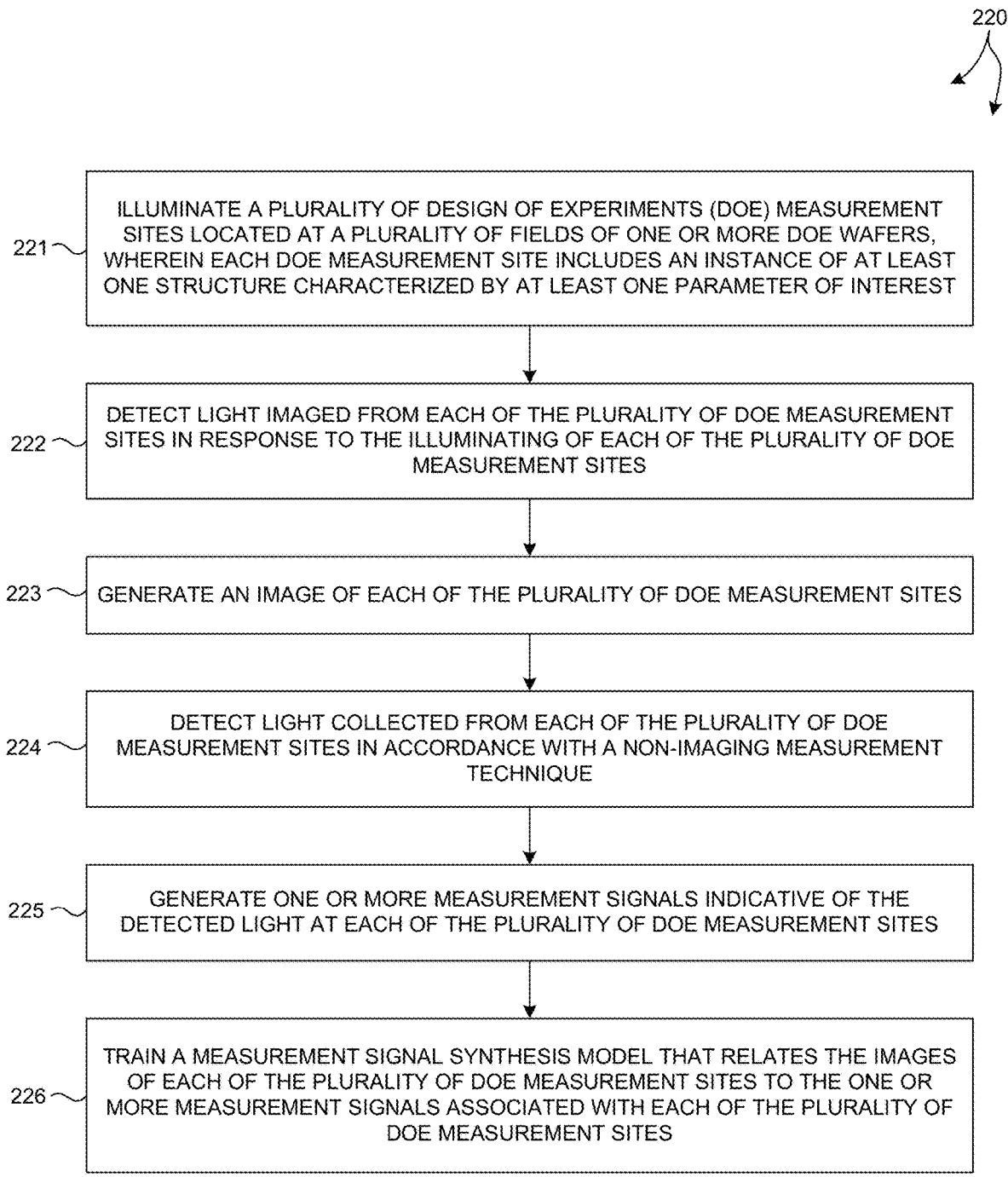
FIG. 9 is a flowchart illustrative of a method 220 of training a measurement signal synthesis model as described herein.

FIG. 9 illustrates a method 220 suitable for implementation by a measurement system such as measurement system 100 illustrated in FIG. 1 of the present invention. In one aspect, it is recognized that data processing blocks of method 200 may be carried out via a pre-programmed algorithm executed by one or more processors of computing system 130, or any other general purpose computing system. It is recognized herein that the particular structural aspects of measurement system 100 do not represent limitations and should be interpreted as illustrative only.

In block 221, a plurality of DOE measurement sites are illuminated by an illumination source. The DOE measurement sites are located at a number of different fields located on one or more DOE wafers. Each DOE measurement site includes an instance of at least one structure characterized by at least one parameter of interest. The structure can be a dedicated metrology target, device structure, grating structure, etc.

As described with reference to method 200, the parameters of interest include one or more process parameters, structural parameters, dispersion parameters, or layout parameters. Each of the measurement sites includes the same nominal structures at the same nominal locations within each of the measurement sites. In one example, a measurement site encompasses a field area of a semiconductor wafer that is repeatedly constructed across the wafer surface. In some examples, a measurement site encompasses a die area that is repeatedly constructed across the wafer surface.

Although, each measurement site nominally includes the same structures, in reality, and for purposes of model training, each measurement site includes variations of various parameters (e.g., CD, sidewall angle, height, overlay, etc.). For purposes of model training, variations of the parameter(s) of interest are organized in a Design of Experiments (DOE) pattern on the surface of a semiconductor wafer (e.g., DOE wafer) as described with reference to method 200.

In block 222, light imaged from each of the plurality of DOE measurement sites is detected in response to the illuminating of each of the plurality of DOE measurement sites. In one example, field imaging detector 114 depicted in FIG. 1 detects light imaged from the surface of wafer 107 at each DOE measurement site. In another example, pupil imaging detector 117 detects light imaged from the pupil of objective 106 at each DOE measurement site.

In block 223, an image of each of the plurality of DOE measurement sites is generated. In one example, field imaging detector 114 generates an image of each of the DOE measurement sites and communicates signals 122 indicative of each generated image to computing system 130. In another example, pupil imaging detector 117 generates a pupil image of each of the DOE measurement sites and communicates signals indicative of each generated pupil image to computing system 130.

In some examples, a single image of each measurement site is generated. In these examples, each image of each measurement site includes a single measurement signal value associated with each image pixel. In some examples, the single measurement value is a reflectance at the location of each pixel measured by an imaging reflectometer at a particular set of measurement system settings (e.g., wavelength, polarization, angle of incidence, azimuth angle, etc.). In some other examples, multiple images of each measurement site are generated, as described with reference to method 200.

In some examples, the image data is subjected to the same alignment, filtering, sampling, and feature extraction steps described with reference to method 200. Although, the use of any, or all, of these steps may be advantageous, in general, it is not necessary. In this sense, these steps are optional.

In block 224, light collected from each parameterized structure located within each of the plurality of DOE measurement sites is detected in accordance with one or more non-imaging measurement techniques. In one example depicted in FIG. 1, spectroscopic field detector 113 detects light collected from one or more structures characterized by each parameter of interest within each measurement site.

In block 225, one or more measurement signals indicative of the detected light at each of the plurality of DOE measurement sites is generated. In one example, depicted in FIG. 1, spectroscopic field detector 113 generates measurement signals 121 indicative of light collected from one or more structures characterized by each parameter of interest within each measurement site. In this example, the measurement signals are spectroscopic scatterometry signals.

In block 226, a measurement signal synthesis model is trained. The measurement signal synthesis model relates the images of each of the plurality of DOE measurement sites to the one or more sets of measurement signals associated with each non-imaging measurement of each parameterized structure at each of the plurality of DOE measurement sites. The measurement signal synthesis model is structured to receive image data generated by a metrology system at one or more measurement sites, and directly determine synthetic measurement signals associated with a non-imaging measurement of each parameterized structure located within each of the plurality of DOE measurement sites. In some embodiments, the measurement signal synthesis model is implemented as a neural network model. In one example, the number of nodes of the neural network is selected based on the features extracted from the image data. In other examples, the measurement signal synthesis model may be implemented as a linear model, a polynomial model, a response surface model, a support vector machines model, or other types of models. In some examples, the measurement signal synthesis model may be implemented as a combination of models. In some examples, the selected model is trained based on the reduced set of signals determined from the feature extraction model and the signals measured based on one or more non-imaging metrology techniques. The model is trained such that its output fits the measured signals for all the images in the parameter variation space defined by the DOE images.

As depicted in FIG. 1, computing system 130 trains an measurement signal synthesis model such that its output fits the measured signals 121 associated each parameterized structure measured within each DOE measurement site for each image of each DOE measurement site received from field imaging detector 114 or pupil imaging detector 117.

In one further aspect, the trained measurement signal synthesis model is employed to transform measured images into synthetic non-imaging based measurement signals associated with one or more model-based measurement techniques. The one or more model-based measurement techniques are employed to estimate values of structural parameters of interest based on the synthetic signals.

Figure 10:
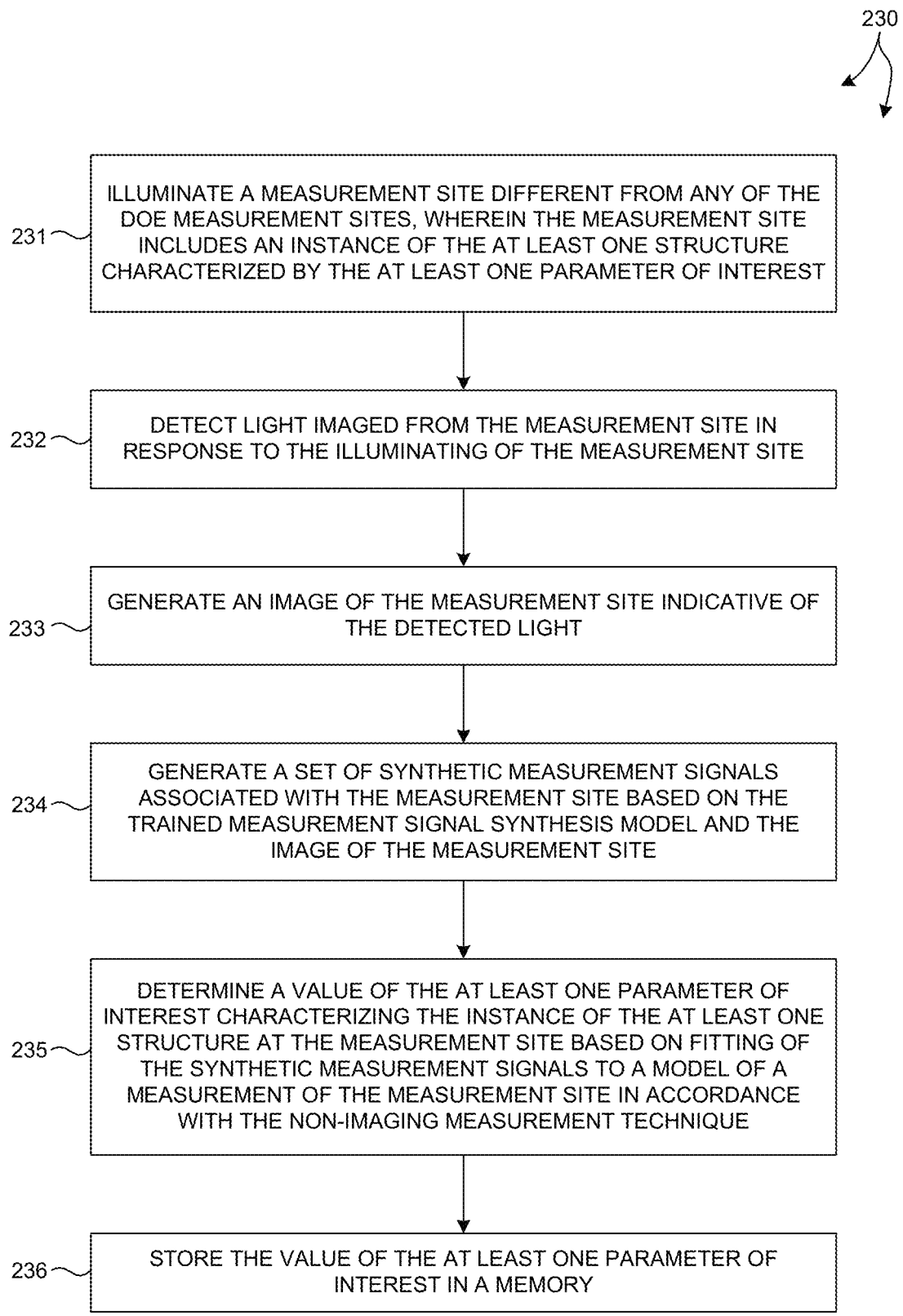
FIG. 10 is a flowchart illustrative of a method 230 of performing measurements of a structure using the measurement signal synthesis model described with reference to method 220.

FIG. 10 illustrates a method 230 suitable for implementation by a metrology system such as metrology system 100 illustrated in FIG. 1 of the present invention. In one aspect, it is recognized that data processing blocks of method 230 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 231, a measurement site is illuminated in accordance with the same image based metrology technique, or combination of image based metrology techniques employed to generate the images used to train the measurement signal synthesis model. The measurement site is a different measurement site than any of the DOE measurement sites. The measurement site includes an instance of at least one structure characterized by the parameter(s) of interest.

In block 232, light imaged from the measurement site is detected in response to the illuminating of the measurement site. In one example, field imaging detector 114 depicted in FIG. 1 detects light imaged from the surface of wafer 107 at the measurement site. In another example, pupil imaging detector 117 detects light imaged from the pupil of objective 106 at the measurement site.

In block 233, an image of the measurement site is generated. In one example, field imaging detector 114 generates an image of the measurement site and communicates signals 122 indicative of the generated image to computing system 130. In another example, pupil imaging detector 117 generates a pupil image of the measurement site and communicates signals indicative of the generated pupil image to computing system 130.

In some examples, the image data is subjected to the same alignment, filtering, sampling, and feature extraction steps described with reference to method 230. Although, the use of any, or all, of these steps may be advantageous, in general, it is not necessary. In this sense, these steps are optional.

In block 234, a set of synthetic measurement signals associated with the measurement site is generated based on the trained measurement signal synthesis model and the image of the measurement site. The synthetic measurement signals are associated with different instances of the same structure(s) characterized by each parameter of interest within each measurement site used for training of the measurement signal synthesis model. In one example, the synthetic measurement signals are associated with a measurement performed by spectroscopic field detector 113 depicted in FIG. 1.

In block 235, a value of at least one parameter of interest characterizing the instance of the at least one structure at the measurement site is determined based on a fitting of the synthetic measurement signals to a model of a measurement of the measurement site in accordance with the non-imaging measurement technique. In one example, the set of synthetic signals are received by computing system 130. Computing system 130 performs a model based measurement (e.g., optical critical dimension measurement) to estimate the value of each parameter of interest at each measurement site based on the set of synthetic measurement signals.

In block 236, the determined value(s) of the parameter(s) of interest are stored in a memory. For example, the parameter values may be stored on-board the measurement system 100, for example, in memory 132, or may be communicated (e.g., via output signal 140) to an external memory device.

In another further aspect, values of parameters of interest may be determined from images of on-device structures in accordance with the systems and methods described herein. In some embodiments, images of on-device structures are used to train an image-based SRM model or a measurement signal synthesis model as described herein. The trained models are then used to calculate values of one or more parameters of interest directly from images, or indirectly, via synthetic signals, of the same on-device structures collected from other wafers. In these embodiments, the use of specialized targets is avoided. In some other embodiments, metrology targets are used and the target size can be less than 10 microns by 10 microns. In general, if metrology targets are used, multiple targets can be measured from single image and the metrology target can include one structure or more than one different structure.

Exemplary structures characterized by parameters of interest measured in accordance with the methods and systems described herein include line-space grating structures, FinFET structures, SRAM memory structures, FLASH memory structures, and DRAM memory structures.

As described hereinbefore, the measurement methods and systems described herein are not constrained to specialized targets. In general, any target that exhibits sensitivity to a parameter of interest when imaged by the available imaging system may be employed in accordance with the methods and systems described herein. However, in some examples, it is advantageous to employ specialized measurement targets that exhibit high sensitivity to a parameter of interest when imaged by the available imaging system to enhance image-based measurement performance. In some examples, measurement targets are located in the scribe lines of a semiconductor area. In other examples, the measurement targets are located within the device area.

In another further aspect, the methods and systems for training the image-based measurement model include an optimization algorithm to automate any or all of the elements required to arrive at a trained model.

In some examples, an optimization algorithm is configured to maximize the performance of the measurement (defined by a cost function) by optimizing any or all of the following parameters: the list of image filters, the parameters of the filters, pixel sampling, the type of feature extraction model, the parameters of the selected feature extraction model, the type of measurement model, the parameters of the selected measurement model. The optimization algorithm can include user defined heuristics and can be combination of nested optimizations (e.g., combinatorial and continuous optimization).

In a further aspect, image data including multiple, different targets is collected for model building, training, and measurement. The use of image data associated with multiple targets having different structure, but formed by the same process conditions increases the information embedded in the model and reduces the correlation to process or other parameter variations. In particular, the use of training data that includes images of multiple, different targets at one or more measurement sites enables more accurate estimation of values of parameters of interest. In one example, different grating structures or film pads are utilized as targets for model training and measurement as described herein.

In another further aspect, signals from multiple targets can be processed to reduce sensitivity to process variations and increase sensitivity to the parameters of interest. In some examples, signals from images, or portions of images, of different targets are subtracted from one another. In some other examples, signals from images, or portions of images, of different targets are fit to a model, and the residuals are used to build, train, and use the models as described herein. In one example, image signals from two different targets are subtracted to eliminate, or significantly reduce, the effect of process noise in each measurement result. In another example, measurement signals from multiple targets are subtracted to eliminate, or significantly reduce, the effect of under layers in each measurement result. The use of measurement data associated with multiple targets increases the sample and process information embedded in the model. In general, various mathematical operations can be applied between the signals from different target images, or portions of target images to determine image signals with reduced sensitivity to process variations and increased sensitivity to the parameters of interest.

In another further aspect, measurement data derived from measurements performed by a combination of multiple, different measurement techniques is collected for model building, training, and measurement. The use of measurement data associated with multiple, different measurement techniques increases the information content in the combined set of signals and reduces the correlation to process or other parameters variations. Different measurement sites may be measured by multiple, different measurement techniques to enhance the measurement information available for estimation of parameters of interest.

In another further aspect, measurement results at multiple wavelengths are combined for model training and measurement in accordance with the methods and systems described herein.

In general, any image based measurement technique, or combination of two or more image based measurement techniques may be contemplated within the scope of this patent document as the data processed by any of the feature extraction model, the image-based SRM model, and the measurement signal synthesis model is in vector form. Because the models operate on vectors of data, each pixel of image data is treated independently. In addition, it is possible to concatenate data from multiple, different metrologies, regardless of whether the data is two dimensional image data, one dimensional image data, or even single point data.

Exemplary measurement techniques that may be applied to provide measurement signals for model training and measurement models for parameter estimation in accordance with the methods described herein include, but are not limited to spectroscopic ellipsometry at one or more angles of illumination, including Mueller matrix ellipsometry, spectroscopic reflectometry, angle resolve reflectometry, spectroscopic scatterometry, scatterometry overlay, beam profile reflectometry, both angle-resolved and polarization-resolved, beam profile ellipsometry, single or multiple discrete wavelength ellipsometry, single wavelength reflectometry, single wavelength ellipsometry, transmission small angle x-ray scatterometer (TSAXS), small angle x-ray scattering (SAXS), grazing incidence small angle x-ray scattering (GISAXS), wide angle x-ray scattering (WAXS), x-ray reflectivity (XRR), x-ray diffraction (XRD), grazing incidence x-ray diffraction (GIXRD), high resolution x-ray diffraction (HRXRD), x-ray photoelectron spectroscopy (XPS), x-ray fluorescence (XRF), grazing incidence x-ray fluorescence (GIXRF), x-ray tomography, x-ray ellipsometry, scanning electron microscopy, tunneling electron microscopy, and atomic force microscopy. Any of the aforementioned metrology techniques may be implemented separately as part of a stand-alone measurement system, or combined into an integrated measurement system. In general, measurement data collected by different measurement technologies and analyzed in accordance with the methods described herein may be collected from multiple tools, rather than one tool integrating multiple technologies.

In another further aspect, signals measured by multiple metrologies can be processed to reduce sensitivity to process variations and increase sensitivity to the parameters of interest. In some examples, signals from images, or portions of images, of targets measured by different metrologies are subtracted from one another. In some other examples, signals from images, or portions of images, of targets measured by different metrologies are fit to a model, and the residuals are used to build, train, and use the image-based measurement model as described herein. In one example, image signals from a target measured by two different metrologies are subtracted to eliminate, or significantly reduce, the effect of process noise in each measurement result. In general, various mathematical operations can be applied between the signals of target images, or portions of target images, measured by different metrologies to determine image signals with reduced sensitivity to process variations and increased sensitivity to the parameters of interest.

In general, image signals from multiple targets each measured by multiple metrology techniques increases the information content in the combined set of signals and reduces the overlay correlation to process or other parameters variations.

In another further aspect, image data and non-imaging data may be collected from measurement targets such as dedicated metrology targets, device structures, or proxy structures found within the fields or die areas on the wafer, or within scribe lines.

In some examples, the measurement methods described herein are implemented as an element of a SpectraShape® optical critical-dimension metrology system available from KLA-Tencor Corporation, Milpitas, Calif., USA.

In some other examples, the measurement methods described herein are implemented off-line, for example, by a computing system implementing AcuShape® software available from KLA-Tencor Corporation, Milpitas, Calif., USA.

In yet another aspect, the measurement results described herein can be used to provide active feedback to a process tool (e.g., lithography tool, etch tool, deposition tool, etc.). For example, values of overlay error determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively.

In general, the systems and methods described herein can be implemented as part of the process of preparing a measurement model for off-line or on-tool measurement. In addition, the measurement model may describe one or more target structures, device structures, and measurement sites.

In a further aspect, an image utilized for model training and measurement as described herein is a result of a linear or non-linear transformation from multiple partial images of different locations in the field.

In another further aspect, an image utilized for model training and measurement as described herein is a result of a linear or non-linear transformation from multiple partial images of different locations in different fields.

In another further aspect an image utilized for model training and measurement as described herein is a result of a linear or non-linear transformation from multiple partial images of different locations in a field and non-imaging measurement signals (e.g., scatterometry signals) used for model training are associated with different measurement locations in the field.

In a further embodiment, system 100 may include one or more computing systems 130 employed to perform measurements in accordance with the methods described herein. The one or more computing systems 130 may be communicatively coupled to the detectors of system 100. In one aspect, the one or more computing systems 130 are configured to receive measurement data associated with measurements of the structure of specimen 107.

It should be recognized that the various steps described throughout the present disclosure may be carried out by a single computer system 130 or, alternatively, a multiple computer system 130. Moreover, different subsystems of the system 100, such as the scatterometer and the beam profile reflectometer, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the detectors of system 100 in any manner known in the art. For example, the one or more computing systems 130 may be coupled to computing systems associated with the detectors of system 100. In another example, the detectors may be controlled directly by a single computer system coupled to computer system 130.

The computer system 130 of the metrology system 100 may be configured to receive and/or acquire data or information from the subsystems of the system (e.g., detectors 113, 114, and 117, and the like) by a transmission medium that may include wireline and/or wireless portions. In this manner, the transmission medium may serve as a data link between the computer system 130 and other subsystems of the system 100.

Computer system 130 of system 300 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or other external systems). For example, the computing system 130 may be configured to receive measurement data from a storage medium (i.e., memory 132 or an external memory) via a data link. For instance, spectral measurement results obtained using spectrometer 113 may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a parameter value 140 determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A system comprising:
    at least one illumination source configured to illuminate a plurality of Design Of Experiments (DOE) measurement sites located at a plurality of fields of one or more DOE wafers, wherein each DOE measurement site includes an instance of at least one structure characterized by at least one parameter of interest;
    an imaging detector configured to detect light imaged from each of the plurality of DOE measurement sites and generate an image of each of the plurality of DOE measurement sites;
    a non-imaging detector configured to detect light collected from each of the plurality of DOE measurement sites in accordance with a non-imaging measurement technique and generate one or more measurement signals indicative of the detected light at each of the plurality of DOE measurement sites; and
    a computing system configured to:
        receive the images of each of the plurality of DOE measurement sites and the one or more measurement signals associated with each of the plurality of DOE measurement sites; and
        train a measurement signal synthesis model that relates the images of each of the plurality of DOE measurement sites to the one or more measurement signals associated with each of the plurality of DOE measurement sites.

2. The system of claim 1, wherein the at least one illumination source is further configured to illuminate a measurement site different from any of the DOE measurement sites, wherein the measurement site includes an instance of the at least one structure characterized by the at least one parameter of interest;
    wherein the at least one imaging detector is further configured to detect light imaged from the measurement site and generate an image of the measurement site indicative of the detected light,
    wherein the computing system is further configured to:
    receive the image of the measurement site;
    generate a set of synthetic measurement signals associated with the measurement site based on the trained measurement signal synthesis model and the image of the measurement site;
    determine a value of the at least one parameter of interest characterizing the instance of the at least one structure at the measurement site based on fitting of the synthetic measurement signals to a model of a measurement of the measurement site in accordance with the non-imaging measurement technique; and
    store the value of the at least one parameter of interest in a memory.

3. The system of claim 2, wherein a measurement signal value is associated with each pixel of each image of each of the plurality of DOE measurement sites and the measurement site, and wherein the image of the measurement site is derived from measurements performed by the same measurement technique or combination of measurement techniques at each image of each of the plurality of DOE measurement sites.

4. The system of claim 2, wherein the computing system is further configured to:
    extract features from each image of each of the plurality of DOE measurement sites with a feature extraction model that reduces a dimension of each of the images, wherein the measurement signal synthesis model relates the features extracted from each of the images of each of the plurality of DOE measurement sites to the one or more measurement signals associated with each of the plurality of DOE measurement sites; and
    extract features from the image of the measurement site with the feature extraction model, wherein the generating of the set of synthetic measurement signals associated with the measurement site is based on the trained measurement signal synthesis model and the features extracted from the image of the measurement site.

5. The system of claim 4, wherein the feature extraction model is any of a principal component analysis (PCA) model, an independent component analysis (ICA) model, a kernel PCA model, a non-linear PCA model, a fast Fourier transform (FFT) model, a discrete cosine transform (DCT) model, and a wavelet model.

6. The system of claim 1, wherein the non-imaging measurement technique is a model based x-ray metrology technique, a model based optical metrology technique, or any combination thereof.

7. The system of claim 1, wherein the plurality of Design Of Experiments (DOE) measurement sites includes a variation in value of the at least one parameter of interest.

8. The system of claim 1, wherein each DOE measurement site includes any of a metrology target, a periodic grating structure, and a device structure.

9. The system of claim 1, wherein the at least one structure is any of a line-space grating structure, a FinFET structure, a SRAM memory structure, a FLASH memory structure, and a DRAM memory structure.

10. The system of claim 1, wherein the at least one parameter of interest is any of a process parameter value, a structural parameter value, a dispersion parameter value, and a layout parameter value.

11. The system of claim 1, wherein the at least one parameter of interest is any of a critical dimension (CD) parameter, an overlay parameter, a focus parameter, a dose parameter, a structure asymmetry parameter, a structure roughness parameter, a directed self assembly (DSA) pattern uniformity parameter, and a pitch walk parameter.

12. The system of claim 1, wherein the non-imaging measurement technique is any of an optical based scatterometry measurement system and an x-ray based scatterometry measurement system.

13. The system of claim 1, wherein the measurement signal synthesis model is any of a linear model, a polynomial model, a neural network model, a support vector machines model, a decision tree model, and a random forest model.

14. A method comprising:
    illuminating a plurality of Design Of Experiments (DOE) measurement sites located at a plurality of fields of one or more DOE wafers, wherein each DOE measurement site includes an instance of at least one structure characterized by at least one parameter of interest;

detecting light imaged from each of the plurality of DOE measurement sites in response to the illuminating of the plurality of DOE measurement sites;

generating an image of each of the plurality of DOE measurement sites;

detecting light collected from each of the plurality of DOE measurement sites in accordance with a non-imaging measurement technique;

generating one or more measurement signals indicative of the detected light at each of the plurality of DOE measurement sites; and training a measurement signal synthesis model that relates the images of each of the plurality of DOE measurement sites to the one or more measurement signals associated with each of the plurality of DOE measurement sites.

15. The method of claim 14, further comprising:

illuminating a measurement site different from any of the DOE measurement sites, wherein the measurement site includes an instance of the at least one structure characterized by the at least one parameter of interest;

detecting light imaged from the measurement site in response to the illuminating of the measurement site;

generating an image of the measurement site indicative of the detected light;

generating a set of synthetic measurement signals associated with the measurement site based on the trained measurement signal synthesis model and the image of the measurement site; and determining a value of the at least one parameter of interest characterizing the instance of the at least one structure at the measurement site based on fitting of the synthetic measurement signals to a model of a measurement of the measurement site in accordance with the non-imaging measurement technique; and storing the value of the at least one parameter of interest in a memory.

16. The method of claim 15, wherein a measurement signal value is associated with each pixel of each image of each of the plurality of DOE measurement sites and the measurement site, and wherein the image of the measurement site is derived from measurements performed by the same measurement technique or combination of measurement techniques as each image of each of the plurality of DOE measurement sites.

17. The method of claim 15, further comprising:

extracting features from each image of each of the plurality of DOE measurement sites with a feature extraction model that reduces a dimension of each of the images, wherein the measurement signal synthesis model relates the features extracted from each of the images of each of the plurality of DOE measurement sites to the one or more measurement signals associated with each of the plurality of DOE measurement sites; and extracting features from the image of the measurement site with the feature extraction model, wherein the generating of the set of synthetic measurement signals associated with the measurement site is based on the trained measurement signal synthesis model and the features extracted from the image of the measurement site.

18. The method of claim 14, wherein the at least one structure is any of a line-space grating structure, a FinFET structure, a SRAM memory structure, a FLASH memory structure, and a DRAM memory structure.

19. The method of claim 14, wherein the at least one parameter of interest is any of a critical dimension (CD) parameter, an overlay parameter, a focus parameter, a dose parameter, a structure asymmetry parameter, a structure roughness parameter, a directed self assembly (DSA) pattern uniformity parameter, and a pitch walk parameter.

20. The method of claim 14, wherein the measurement signal synthesis model is any of a linear model, a polynomial model, a neural network model, a support vector machines model, a decision tree model, and a random forest model.

* * * * *